US007078145B2

(12) United States Patent
Yanaka

(10) Patent No.: US 7,078,145 B2
(45) Date of Patent: Jul. 18, 2006

(54) LITHOGRAPHIC PRINTING PLATE PRECURSOR

(75) Inventor: Hiromitsu Yanaka, Shizuoka (JP)

(73) Assignee: Fuji Photo Film Co., Ltd., Minami Ashigara (JP)

(*) Notice: Subject to any disclaimer, the term of this patent is extended or adjusted under 35 U.S.C. 154(b) by 62 days.

(21) Appl. No.: 10/386,502

(22) Filed: Mar. 13, 2003

(65) Prior Publication Data

US 2003/0188653 A1 Oct. 9, 2003

(30) Foreign Application Priority Data

Mar. 13, 2002 (JP) .......................... P.2002-068628

(51) Int. Cl.
*G03F 7/021* (2006.01)

(52) U.S. Cl. ...................... 430/138; 430/157; 430/162; 430/302

(58) Field of Classification Search ................ 430/157, 430/138, 162, 302
See application file for complete search history.

(56) References Cited

U.S. PATENT DOCUMENTS

| | | | | |
|---|---|---|---|---|
| 5,928,833 | A * | 7/1999 | Matthews et al. | 430/138 |
| 6,180,213 | B1 * | 1/2001 | Kuroki et al. | 428/195.1 |
| 6,391,516 | B1 * | 5/2002 | Vermeersch et al. | 430/270.1 |
| 6,399,270 | B1 * | 6/2002 | Mori et al. | 430/270.1 |
| 6,637,334 | B1 * | 10/2003 | Akiyama et al. | 101/457 |
| 6,740,464 | B1 * | 5/2004 | Maemoto | 430/138 |
| 2004/0106060 | A1 * | 6/2004 | Maemoto | 430/138 |

FOREIGN PATENT DOCUMENTS

| | | |
|---|---|---|
| EP | 0 800 928 A1 | 10/1997 |
| EP | 1 160 083 A2 | 12/2001 |
| JP | 9-127683 | 5/1997 |
| JP | 2938397 | 6/1999 |
| WO | WO99/10186 | 3/1999 |

* cited by examiner

*Primary Examiner*—John S. Chu
(74) *Attorney, Agent, or Firm*—Buchanan Ingersoll PC

(57) ABSTRACT

A lithographic printing plate precursor comprising: a hydrophilic support; and an image-forming layer which comprises (A) at least one of: hydrophobic polymer particles comprising a compound having an onium group; and microcapsules encapsulating a compound having an onium group and a hydrophobic compound, and (B) a light-to-heat converting agent.

16 Claims, No Drawings

LITHOGRAPHIC PRINTING PLATE PRECURSOR

FIELD OF THE INVENTION

The present invention relates to a lithographic printing plate precursor, more particularly relates to a lithographic printing plate precursor capable of plate-making by scanning exposure based on digital signals, highly sensitive and excellent in press life, capable of providing printed matters without being accompanied by smear, and capable of being directly mounted on a printing press without undergoing a development process by a special processor after exposure to effect printing.

BACKGROUND OF THE INVENTION

Various studies have shown that plate-making for computer-to-plate (CTP) systems have greatly advanced in recent years. Of these studies, lithographic printing plate precursors capable of being mounted on a printing press without undergoing a development process by a special processor after exposure to effect printing are studied for the purpose of further rationalization of the process and solution of the problems of discarding of waste solution, and various methods are suggested.

As one method of omitting a development process by a special processor, a method of mounting an exposed printing plate precursor on the cylinder of a printing press, and removing a non-image area of the printing plate precursor by supplying a fountain solution and ink with revolving the cylinder which is called on-press development is known. That is, this is a method of mounting a lithographic printing plate precursor on a printing press after exposure as it is and terminating a development process in a usual printing process.

A lithographic printing plate precursor suited for on-press development is required to have a photosensitive layer soluble in a fountain solution and an ink solvent, and daylight handling property as well, since a printing plate precursor is development processed on a printing press put in a bright room.

For example, a lithographic printing plate precursor comprising a hydrophilic support having provided thereon a photosensitive layer containing a hydrophilic binder polymer having dispersed therein thermoplastic hydrophobic polymer fine particles is disclosed in Japanese Patent 2938397. There is disclosed in the same patent that after an image is formed by coalescing the thermoplastic hydrophobic polymer fine particles by heat by infrared laser exposure in the lithographic printing plate precursor, the printing plate is mounted on the cylinder of a printing press, and on-press development can be effected with a fountain solution and/or ink. Further, JP-A-9-127683 (the term "JP-A" as used herein means an "unexamined published Japanese patent application") and WO 99/10186 also disclose a method of making a printing plate by on-press development after coalescing thermoplastic fine particles by heat. However, there is a problem in these methods of making images only by simple coalescence of fine particles by heating that sensitivity is low and high press life can be obtained with difficulty.

SUMMARY OF THE INVENTION

Accordingly, an object of the present invention is to solve this problem. That is, an object of the invention is to provide a lithographic printing plate precursor having good on-press development property, highly sensitive and excellent in press life.

As a result of eager investigation to achieve the above object, the present inventors have found that the drawback of conventional techniques can be overcome by the following means.

That is, the present invention is as follows.

(1) A lithographic printing plate precursor comprising a hydrophilic support having provided thereon an image-forming layer containing:

(A) at least either component of hydrophobic polymer particles containing a compound having an onium group, or microcapsules encapsulating a compound having an onium group and a hydrophobic compound, and (B) a light-to-heat converting agent.

(2) The lithographic printing plate precursor as described in the above item (1), wherein the compound having an onium group has two or more onium salt moieties in the same molecule.

(3) The lithographic printing plate precursor as described in the above item (1) or (2), wherein the compound having an onium group is a diazonium salt.

In the lithographic printing plate precursor of the present invention, an image area generates heat by a light-to-heat converting substance by exposure, and the hydrophobic polymer particles contained in an image-forming layer are at least partially fused, or a hydrophobic compound is released from microcapsules, and a hydrophobic layer is formed. Further, in the present invention, a compound having an onium group is contained in the hydrophobic polymer particles, or encapsulated in microcapsules together with a hydrophobic component. The compound having an onium group used in the present invention has strong interaction with a hydrophilic substrate. Accordingly, the compound having an onium group is released only at a part which generates heat by exposure, and the adhesion of the image-forming layer containing the hydrophobic polymer particles or microcapsules encapsulating a hydrophobic compound to the substrate is improved. By virtue of this constitution, the lithographic printing plate precursor of the present invention possesses good on-press development property, and high sensitivity and excellent press life as well. In the invention, the light-to-heat converting substance and the compound having an onium group are differentiated each other, because the compound having an onium group does not absorb infrared rays.

DETAILED DESCRIPTION OF THE INVENTION

The lithographic printing plate precursor in the present invention is described in detail below.

In the first place, an image-forming layer, which is a characteristic part of the lithographic printing plate precursor of the present invention, is described.

Image-Forming Layer:

Compound Having an Onium Group:

As the compounds having an onium group preferably used in the image-forming layer of the lithographic printing plate precursor of the present invention, compounds having an onium group, such as diazonium, phosphonium, sulfonium, ammonium, pyridinium or iodonium, are exemplified. These compounds having an onium group are preferably oligomers or polymers having two or more onium groups in the same molecule from the point of the improvement of press life. Further, the compounds having an onium group are preferably oil-soluble, since they are necessary to be encapsulated in hydrophobic polymer particles and microcapsules.

As the compounds having an onium group preferably used in the invention, e.g., the compounds having at least one structural unit represented by the following formula (1), (2), (3) or (4) are preferred:

(1)

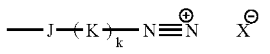

(2)

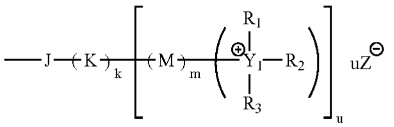

(3)

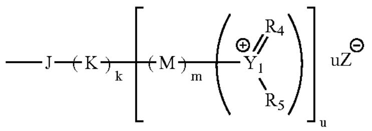

(4)

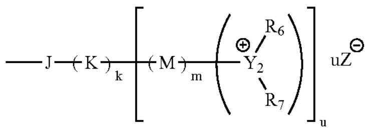

In formula (1), J represents a divalent to tetravalent linking group; K represents an aromatic group or a substituted aromatic group; $X^-$ represents a counter anion, specifically a halogen ion, $PF_6^-$, $BF_4^-$, substituted or unsubstituted arylsulfonate, or $R_8SO_3^-$; and $R_8$ represents a hydrogen atom or an alkyl group.

The representative examples of the compounds having a diazonium group represented by formula (1) which are used in the invention are shown below.

Hexafluorophosphate ionic salt of 4-diazodiphenylamine, p-toluenesulfonate of 4-diazodiphenylamine, copolymer of 4-diazodiphenylaminehexafluorophosphate and formaldehyde, and copolymer of 4-diazodiphenylamine-p-toluenesulfonate and formaldehyde (e.g., PCAS manufactured by Nihon Siber Hegner K.K.) are exemplified.

In formulae (2) to (4), J represents a divalent to tetravalent linking group; K represents an aromatic group or a substituted aromatic group; M represents a divalent linking group; $Y_1$ represents an atom belonging to group XV of the Periodic Table; $Y_2$ represents an atom belonging to group XVI of the Periodic Table; and $Z^-$ represents a counter anion.

$R_1$, $R_2$, $R_3$, $R_5$, $R_6$ and $R_7$ each represents an alkyl group, an aromatic group or an aralkyl group to each of which a hydrogen atom or, in some case, a substituent may be bonded; $R_4$ represents an alkylidyne group or a substituted alkylidyne group, and $R_1$ and $R_2$, or $R_4$ and $R_5$ may be bonded to each other to form a ring; k and m each represents 0 or 1; and u represents an integer of from 1 to 3. Of the constituting components having an onium group, more preferably J represents —COO— or —CONH—, K represents a phenylene group or a substituted phenylene group, and the substituent is a hydroxyl group, a halogen atom, or an alkyl group, M represents an alkylene group, or a divalent linking group represented by molecular formula of $C_nH_{2n}O$, $C_nH_{2n}S$ or $C_nH_{2n+1}N$, where n represents an integer of from 1 to 12, $Y_1$ represents a nitrogen atom or a phosphorus atom, $Y_2$ represents a sulfur atom, and $Z^-$ represents a halogen ion, $PF_6^-$, $BF_4^-$, substituted or unsubstituted arylsulfonate, or $R_8SO_3^-$.

As the specific examples of (2) to (4), oligomers and polymers having a monomer having an onium group shown below as the constitutional unit are exemplified.

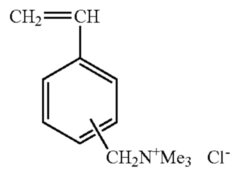

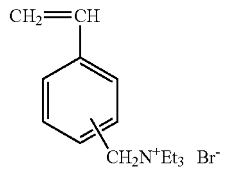

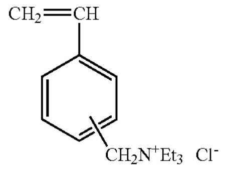

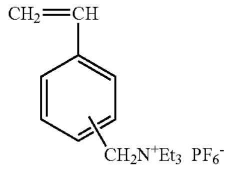

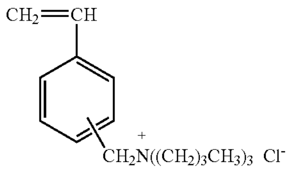

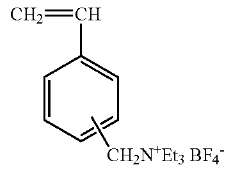

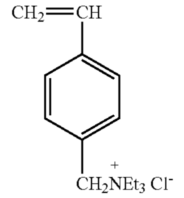

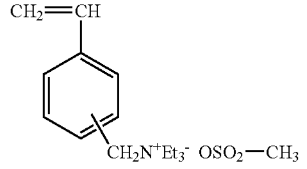

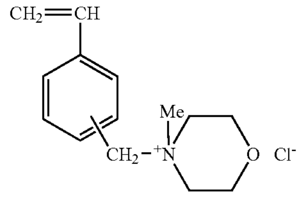

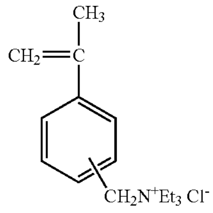

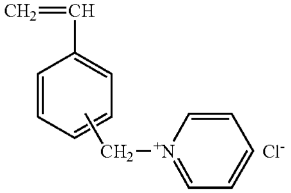

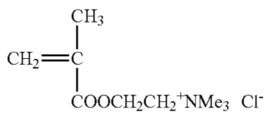

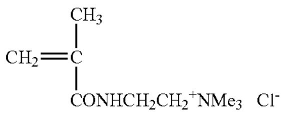

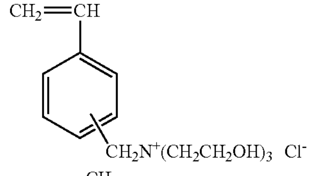

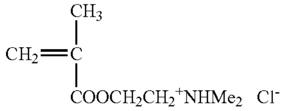

-continued

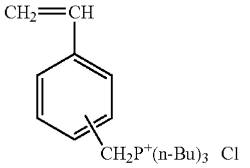

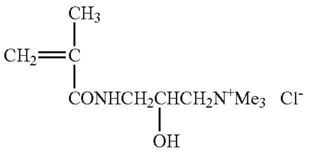

The specific examples of the polymers having these monomers having an onium group as the constitutional unit are shown below, but the present invention is not limited to these compounds. The content of the onium group in the polymer having a monomer having an onium group as the constitutional unit is preferably from 1 to 50 mol. The range of the molecular weight of the polymer having the constitutional unit containing an onium group may be wide, but the weight average molecular weight (Mw) measured by a light scattering method is preferably from 500 to 2,000,000, and more preferably from 2,000 to 600,000. The range of the amount of the unreacted monomers contained in the polymer may be wide, but it is preferably 20 wt % or less, and more preferably 10 wt % or less.

| | Structure | Molecular Weight |
|---|---|---|
| No1. | 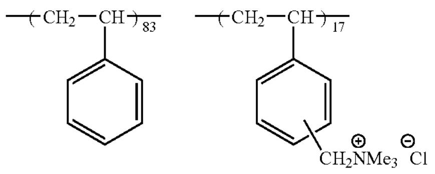 | 31,000 |
| No2 | 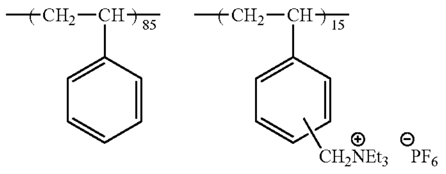 | 24,000 |
| No3. | 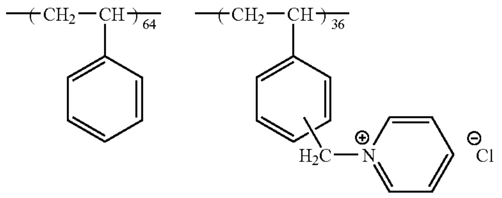 | 41,000 |
| No4. | 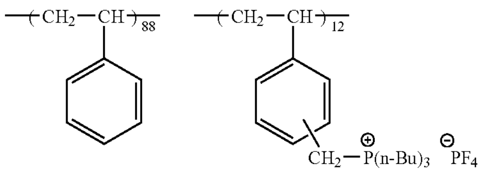 | 16,000 |
| No5. | 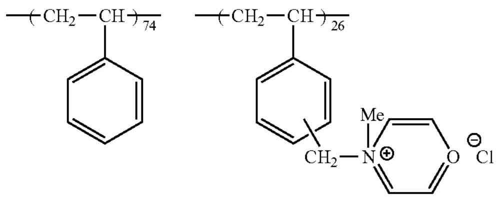 | 26,000 |
| No6 | 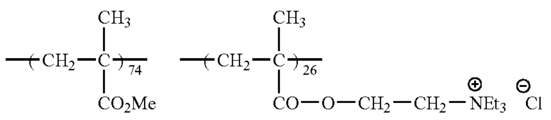 | 13,000 |

-continued

| | Structure | Molecular Weight |
|---|---|---|
| No7 | 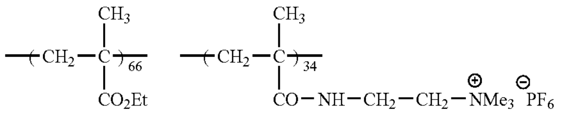 | 47,000 |
| No. 8 | 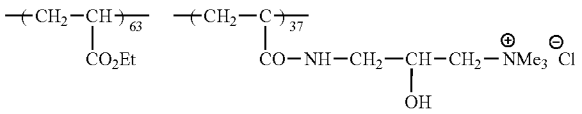 | 25,000 |

These polymers can be generally manufactured by radical polymerization (see F. W. Billmeyer, *Textbook of Polymer Science,* 3rd Ed. (1984), A. Wiley-Interscience Publication). The synthesis example of the polymer for use in the present invention is described below.

Synthesis Example

Synthesis of styrene-vinylbenzyltrimethylammonium chloride copolymer:

Styrene (102.96 g) (0.99 mol), 44.2 g (0.21 mol) of vinylbenzyltrimethylammonium chloride and 446 g of 2-methoxy-ethanol were put in a three necked flask and heated at constant temperature of 75° C. with stirring under nitrogen gas flow. Thereafter, 76 g (12 mmol) of 2,2-azobis (dimethyl-2-isobutyrate) was added to the above solution, followed by stirring. After 2 hours, 76 g (12 mmol) of 2,2-azobis(dimethyl-2-isobutyrate) was further added. Further, after 2 hours, 2.76 g (12 mmol) of 2,2-azobis(dimethylisobutyrate) was added. After stirring the reaction solution for 2 hours, the temperature was lowered to room temperature. This reaction solution was poured into 12 liters of hexane with stirring. The solid precipitated was filtered and dried. The yield was 189.5 g. The obtained solid was confirmed to have a weight average molecular weight (Mw) of 32,000 from the molecular weight measurement by a light scattering method. Other polymer compounds for use in the present invention can also be synthesized by similar methods.

It is preferred that the compound having an onium group is contained in the proportion of from 3 to 50% of the hydrophobic polymer component in the hydrophobic polymer particles or of the hydrophobic compound component in the microcapsules. When the content is less than 3%, press life cannot be improved, and when it is more than 50%, the releasing property of the compound when heat is applied lowers and the improvement of press life cannot be obtained.

Hydrophobic Polymer Particles:

Hydrophobic polymer particles are particles containing hydrophobic polymer which is at least partially fused by heat as the main component, and as such hydrophobic polymer particles, polymer particles which can be manufactured by well-known synthesizing methods, e.g., a phase inversion emulsification method, an emulsion polymerization method, a soap free emulsion polymerization method, a seed polymerization method, a dispersion polymerization method, a solvent evaporation method, a suspension polymerization method, a coacervation method, an interfacial polymerization method, and a spray drying method can be used. In particular, since it is necessary to contain the compound having an onium group, hydrophobic polymer particles manufactured by a phase inversion emulsification method or a solvent evaporation method and dispersed in water are preferred in the points of easiness of manufacturing of a photosensitive material, heat fusion and on-press development property.

As the hydrophobic polymers, well-known thermoplastic polymers and thermosetting polymers which can be made fine particles can be used. The molecular weight of the polymers is preferably from 3,000 to 1,000,000.

As the thermoplastic polymer fine particles which are preferably used in the present invention, the thermoplastic polymer fine particles described in *Research Disclosure*, No. 33303 (January, 1992), JP-A-9-123387, JP-A-9-131850, JP-A-9-171249, JP-A-9-171250 and EP 931647 are exemplified as preferred examples. Specifically, homopolymers or copolymers of monomers, such as ethylene, styrene, vinyl chloride, methyl acrylate, ethyl acrylate, methyl methacrylate, ethyl methacrylate, vinylidene chloride, acrylonitrile, and vinylcarbazole, or mixture of these can be exemplified.

Further, these polymers may have a reactive functional group. As the functional groups, radical polymerizable groups, e.g., an acrylate group, a methacrylate group, a vinyl group and an allyl group, cationic polymerizable groups, e.g., an epoxy group and a vinyl ether group, addition reactive groups, e.g., an amino group, a hydroxyl group, a carboxyl group, isocyanate and acid anhydride, and the groups protecting these groups are exemplified.

As the thermosetting polymer fine particles which are suitable for the present invention, resins having a phenol skeleton, urea-based resins (e.g., resins obtained by resinifying urea or urea derivatives, such as methoxymethylated urea, with aldehydes, such as formaldehyde), melamine-based resins (e.g., resins obtained by resinifying melamine or melamine derivatives with aldehydes, such as formaldehyde), alkyd resins, unsaturated polyester resins, polyurethane resins and epoxy resins can be exemplified.

As the preferred resins having a phenol skeleton, e.g. , novolak resins and resol resins obtained by resinifying phenol or cresol with aldehydes, such as formaldehyde, hydroxystyrene resins, methacrylamide resins and acrylamide resins having a phenol skeleton, e.g., N-(p-hydroxyphenyl)methacrylamide resins, and methacrylate resins and acrylate resins having a phenol skeleton, e.g., p-hydroxyphenyl methacrylate can be exemplified.

The hydrophobic polymer particles have an average particle size of preferably from 0.01 to 3 μm, more preferably from 0.05 to 1.0 μm, and particularly preferably from 0.06 to 0.4 μm. When the average particle size of the hydrophobic polymer particles is in this range, good resolution and storage stability can be obtained.

The addition amount of the hydrophobic polymer particles is preferably 40 wt % or more of the solid content in the image-forming layer, and more preferably 60 wt % or more. When the addition amount is in this range, good on-press development property, good sensitivity and good press life can be obtained simultaneously.

Microcapsules Encapsulating Hydrophobic Compound:

The microcapsules encapsulating a hydrophobic compound for use in the invention is described in detail below.

The hydrophobic compounds to be encapsulated in microcapsules may be any compound so long as they are compounds releasable from microcapsules by heat, e.g., any of hydrophobic low molecular weight compounds, oligomers and thermoplastic and thermosetting polymers described above (hydrophobic polymer particles) can be used.

These hydrophobic compounds are preferably compounds which are crosslinking-reactive by heat, and more preferably compounds having a functional group crosslinking-reactive by heat (hereinafter referred to as a thermoreactive group). As the thermoreactive groups, an ethylenic unsaturated group in polymerization reaction (e.g., an acryloyl group, a methacryloyl group, a vinyl group and an allyl group), an isocyanate group in addition reaction, blocked isocyanate, and a functional group having an active hydrogen atom which is the other group of the reaction (e.g., an amino group, a hydroxyl group, or a carboxyl group), an epoxy group in addition reaction, and an amino group, a carboxyl group or a hydroxyl group which is the other group of the reaction, a carboxyl group and a hydroxyl group or an amino group in condensation reaction, and an acid anhydride and an amino group or a hydroxyl group in ring opening addition reaction can be exemplified. However, thermoreactive groups are not limited to the above groups and any reactive functional groups can be used so long as they form a chemical bond.

The hydrophobic compounds having these thermoreactive groups can improve image strength and provide high press life by thermal reaction.

The microcapsules containing the compounds having these thermoreactive groups can be obtained by the method of encapsulating in microcapsules the compound having a thermoreactive group (described later), e.g., an acrylate group, a methacrylate group, a vinyl group, an allyl group, an epoxy group, an amino group, a hydroxyl group, a carboxyl group, isocyanate, acid anhydride, and the groups protecting these groups, or by the method of encapsulating these compounds in the external walls of microcapsules. The compounds having the thermoreactive groups may be encapsulated in microcapsules and, at the same time, in the external walls of the microcapsules.

The compounds disclosed in JP-A-2001-277740 and JP-A-2001-277742 can be used as the compound having a thermo-reactive group contained in microcapsules.

For making the compound having a thermoreactive group diffused from a microcapsule present on the surface and the vicinity of the surface of the microcapsule in the image-forming layer, e.g., a method of dispersing the compound in a solvent which swells the external wall of the microcapsule can be used.

The materials of microcapsules preferably used in the present invention have three dimensional crosslinking. From this point of view, polyurea, polyurethane, polyester, polycarbonate, polyamide and mixtures of these compounds are preferred as the materials of the microcapsules, and polyurea and polyurethane are particularly preferred. The compounds having the above-described thermoreactive groups may be incorporated in the external walls of microcapsules.

For microencapsulating the compound having a thermoreactive group, well-known microencapsulating methods can be used. The manufacturing methods of microcapsules include, e.g., the methods of utilizing coacervation disclosed in U.S. Pat. Nos. 2,800,457 and 2,800,458, the methods by interfacial polymerization disclosed in British Patent 990,443, U.S. Pat. No. 3,287,154, JP-B-38-19574 (the term “JP-B” as used herein means an “examined Japanese patent publication”), JP-B-42-446 and JP-B-42-711, the methods by the precipitation of a polymer disclosed in U.S. Pat. Nos. 3,418,250 and 3,660,304, the method of using isocyanate polyol wall materials disclosed in U.S. Pat. No. 3,796,669, the method of using isocyanate wall materials disclosed in U.S. Pat. No. 3,914,511, the methods of using urea-formaldehyde series or urea-formaldehyde-resorcinol series wall-forming materials disclosed in U.S. Pat. Nos. 4,001,140, 4,087,376 and 4,089,802, the method of using wall materials, e.g., melamine-formaldehyde resin and hydroxy cellulose, disclosed in U.S. Pat. No. 4,025,445, the in situ methods by monomer polymerization disclosed in JP-B-36-9163 and JP-B-51-9079, the spray drying methods disclosed in British Patent 930,422 and U.S. Pat. No. 3,111,407, and the electrolytic dispersion cooling methods disclosed in British Patents 952,807 and 967,074. However, the invention is not limited to these methods.

The solvent for swelling the external wall of microcapsule depends upon the microcapsule dispersing solvent (also referred to as solvent or coating solution), the material and the thickness of the microcapsule wall, and the compound encapsulated in the microcapsule, but the solvent can be easily selected many commercially available products. For example, in the case of a water-dispersible microcapsule comprising crosslinked polyurea or polyurethane wall, alcohols, ethers, acetals, esters, ketones, polyhydric alcohols, amides, amines and fatty acids are preferably used.

Specifically, methanol, ethanol, tertiary butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide, and N,N-dimethylacetamide are exemplified, but the invention is not limited to these solvents. Further, these solvents may be used two or more in combination.

Solvents which are not dissolved in microcapsule dispersing solvents but are dissolved in the mixture of the solvents can be used as the solvents for swelling the external wall of microcapsule. The content of the solvents for swelling the external wall of microcapsule is determined by the combination of the materials, and when the content is smaller than the suitable value, image formation becomes insufficient, and when the content is greater than the suitable value, the stability of the dispersion lowers. In general, the content of the solvents for swelling the external wall of microcapsule of from 5 to 95 wt % of the coating solution is effective, preferably from 10 to 90 wt %, and more preferably from 15 to 85 wt %.

The average particle size of the microcapsules is preferably from 0.01 to 20 μm, more preferably from 0.05 to 2.0 μm, and particularly preferably from 0.10 to 1.0 μm. When the average particle size of the microcapsules is in this range, good resolution and aging stability can be obtained.

The addition amount of the microcapsules to the image-forming layer is preferably 50 wt % or more in terms of solid content, and more preferably 60 wt % or more. When the addition amount is in this range, good on-press development property, good sensitivity and good press life can be obtained simultaneously.

Light-to-Heat Converting Substance:

The image-forming layer of the present invention contains a light-to-heat converting substance which generates heat by exposure for the purpose of increasing sensitivity. As such a light-to-heat converting substance, light-absorbing substances having absorption band at least at a part of from 700 to 1,200 nm of wavelength, e.g., various kinds of pigments, dyes and metallic fine particles, can be used.

As such pigments, commercially available pigments and the infrared ray-absorbing pigments described in *Color Index* (*C.I.*) *Binran* (*Color Index* (*C.I.*) *Handbook*), *Saishin Ganryo Binran* (*The Latest Pigment Handbook*), compiled by Nihon Ganryo Gijutsu Kyokai (1977), *Saishin Ganryo Oyo Gijutsu* (*The Latest Applied Techniques of Pigments*), published by CMC Publishing Co. Ltd. (1986), and *Insatsu Ink Gijutsu* (*Printing Ink Techniques*), CMC Publishing Co. Ltd. (1984) can be used.

These pigments may be surface-treated by well-known surface treatment methods, if necessary, for improving the dispersibility in a layer to be added. As methods of surface treatments, a method of surface-coating with hydrophilic resins and lipophilic resins, a method of adhering surfactants, and a method of attaching reactive substances (e.g., silica sol, alumina sol, a silane coupling agent, an epoxy compound and an isocyanate compound) on the surfaces of pigments, can be exemplified.

The pigments to be added to the image-forming layer are preferably surface-coated with hydrophilic resins or silica sol so as to be dispersed with water-soluble resins and not to impair the hydrophilic property. The particle size of the pigments is preferably from 0.01 to 1 μm, and more preferably from 0.01 to 0.5 μm. Well-known dispersing methods used in manufacturing inks and toners can be used as dispersing methods of pigments.

Carbon black can be exemplified as a particularly preferred pigment.

As the dyes for this purpose, those commercially available known dyes described, e.g., in *Senryo Binran* (*Dye Handbook*), compiled by Yuki Gosei Kagaku Kyokai (1970), "Kin-Sekigai Kyushu Shikiso (Near Infrared Ray Absorbing Dyes)" in *Kagaku Kogyo* (*Chemical Industry*), pp. 45 to 51 (May, 1986), 90 *Nen-dai Kinosei Shikiso no Kaihatsu to Shijo Doko* (*Development and Market Trend of Functional Dyes in the Nineties*), Item 2.3, Chapter 2, CMC Publishing Co. Ltd. (1990), or various patent specifications can be utilized. Specifically, infrared ray-absorbing dyes, e.g., azo dyes, metal complex salt azo dyes, pyrazolone azo dyes, anthraquinone dyes, phthalocyanine dyes, carbonium dyes, quinoneimine dyes, polymethine dyes, and cyanine dyes are preferably used.

Further, as the dyes for use as the light-to-heat converting substance, e.g., the cyanine dyes disclosed in JP-A-58-125246, JP-A-59-84356 and JP-A-60-78787, the methine dyes disclosed in JP-A-58-173696, JP-A-58-181690 and JP-A-58-194595, the naphthoquinone dyes disclosed in JP-A-58-112793, JP-A-58-224793, JP-A-59-48187, JP-A-59-73996, JP-A-60-52940 and JP-A-60-63744, the squarylium dyes disclosed in JP-A-58-112792, the cyanine dyes disclosed in British Patent 434,875, the cyanine dyes disclosed in U.S. Pat. No. 4,973,572, the dyes disclosed in JP-A-10-268512, and the phthalocyanine compounds disclosed in JP-A-11-235883 can be exemplified.

Further, the near infrared-absorbing sensitizing dye disclosed in U.S. Pat. No. 5,156,938 is also preferably used. In addition, the substituted arylbenzo(thio)pyrylium salt disclosed in U.S. Pat. No. 3,881,924, the trimethine thiapyrylium salt disclosed in JP-A-57-142645, the pyrylium-based compounds disclosed in JP-A-58-181051, JP-A-58-220143, JP-A-59-41363, JP-A-59-84248, JP-A-59-84249, JP-A-59-146063 and JP-A-59-146061, the cyanine dye disclosed in JP-A-59-216146, the pentamethine thiopyrylium salt disclosed in U.S. Pat. No. 4,283,475, the pyrylium compounds disclosed in JP-B-5-13514 and JP-B-5-19702, Epolight III-178, Epolight III-130, and Epolight III-125 (manufactured by Epolin Co., Ltd.) are also particularly preferably used.

Of these dyes, the dyes which are preferably added to the hydrophilic matrix in the hydrophilic resin of the image-forming layer are water-soluble dyes, and the specific examples are shown below, but the present invention is not limited to these dyes.

(IR-1)

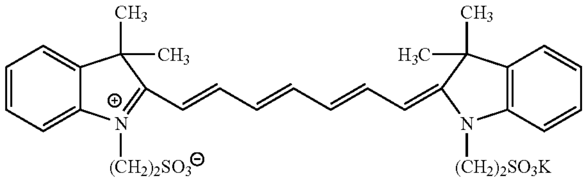

(IR-2)

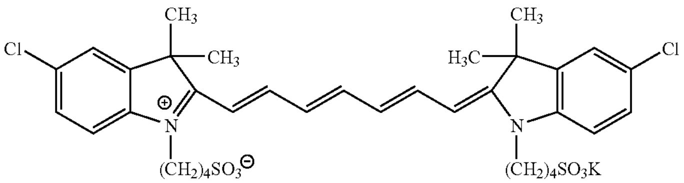

(IR-3)

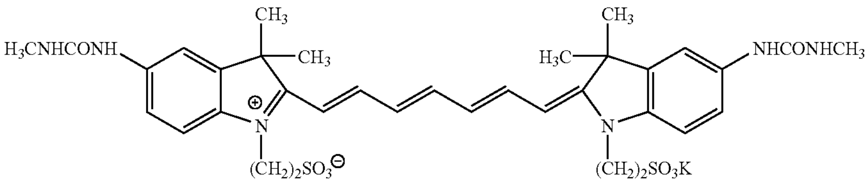

-continued
(IR-4)
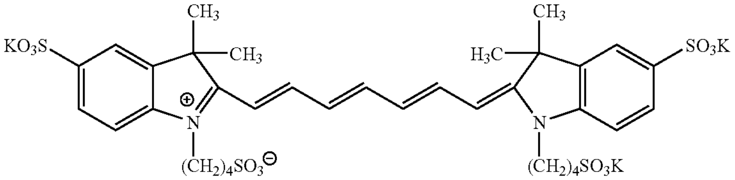
(IR-5)
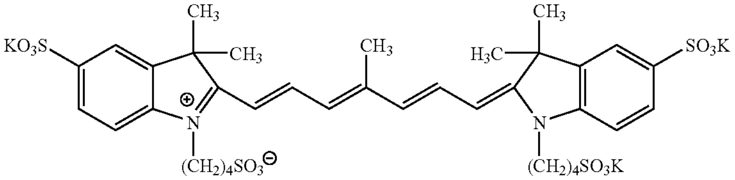
(IR-6)
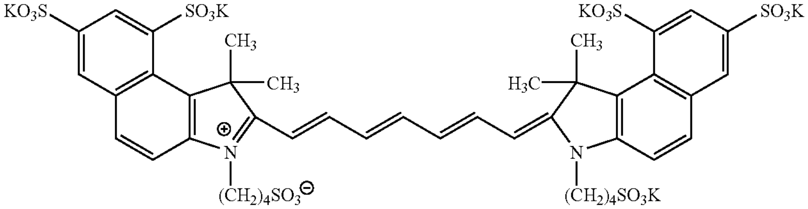
(IR-7)
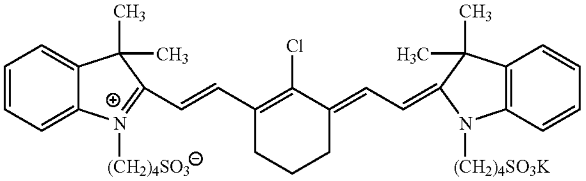
(IR-8)
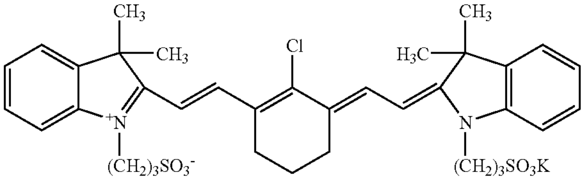
(IR-9)
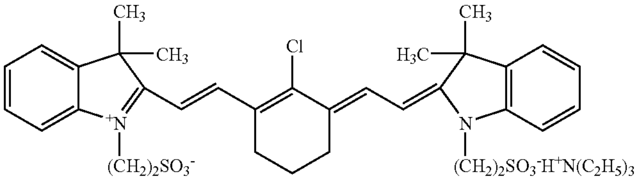
(IR-10)
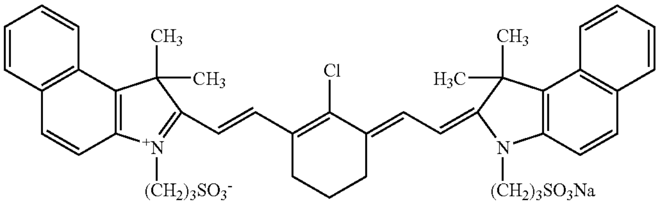
(IR-11)
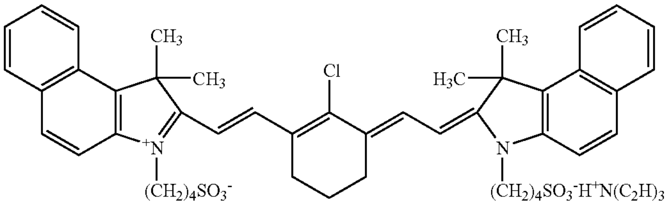

By virtue of light-to-heat converting substance, the light-to-heat converting agent contained in the hydrophobic polymer fine particles further advances the fusion among the particles, which is preferred. The above light-to-heat converting substances are preferred but lipophilic dyes are more preferred. As the specific examples of the lipophilic dyes, the following dyes can be exemplified.

IR12

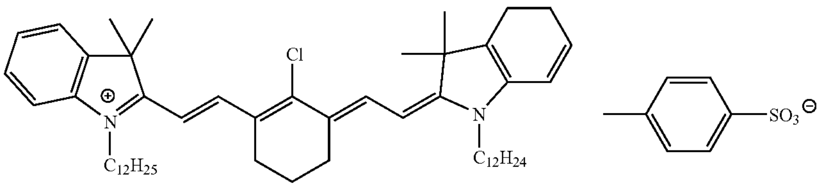

IR13

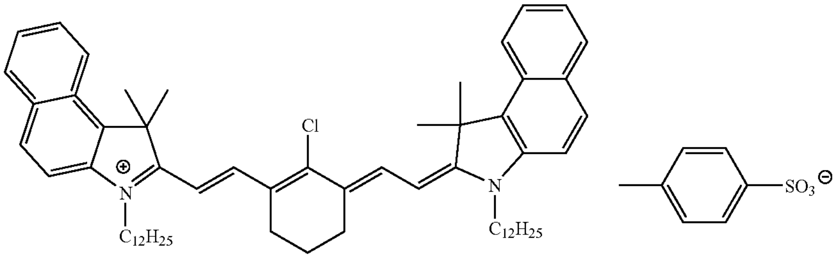

IR14

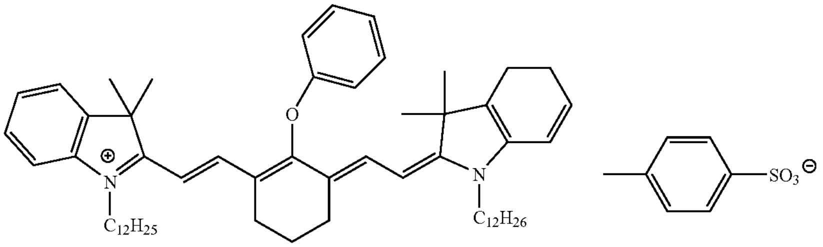

IR15

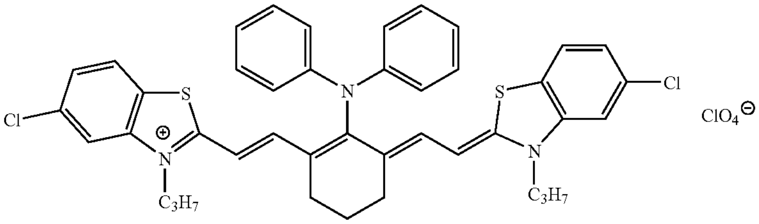

IR16

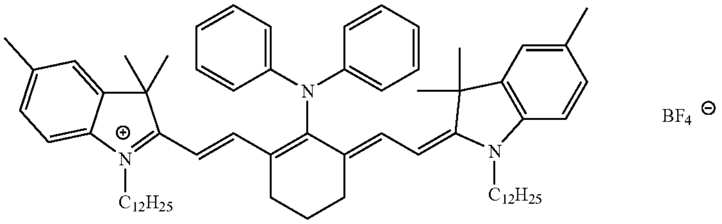

-continued

IR17

M = VO, R = j-$C_5H_{11}$

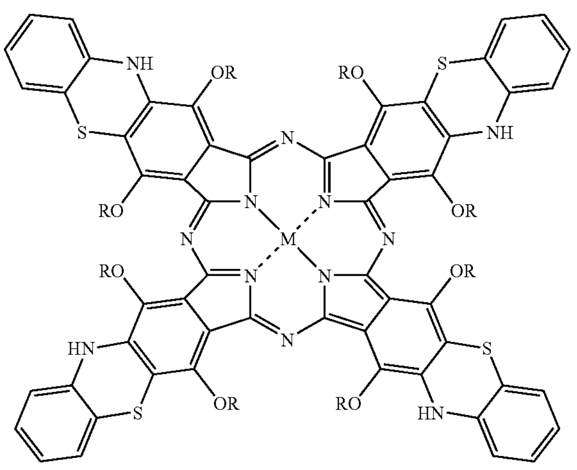

IR18

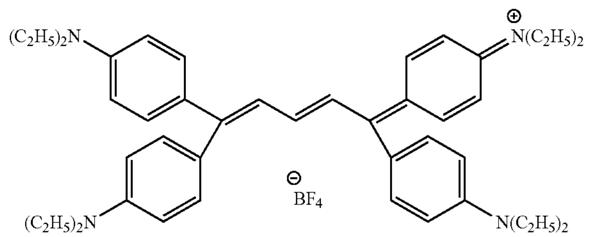

The above organic light-to-heat converting agents can be added to 30 wt % based on the total solid content in the image-forming layer, preferably from 5 to 25 wt %, and particularly preferably from 7 to 20 wt %. In this range of the addition amount, good sensitivity can be obtained.

Metallic fine particles can also be used in the image-forming layer of the present invention as the light-to-heat converting agent. Many metallic fine particles are light-to-heat convertible and self-exothermic as well.

As preferred metallic fine particles, the fine particles of simple substance or alloy or oxides and sulfides of Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re and Sb are exemplified.

The preferred metals among the metals constituting these metallic fine particles are metals having a melting point of about 1,000° C. or less, at which heat fusion of the hydrophobic polymer fine particles by light irradiation easily occurs, and having absorption in the infrared, visible and ultraviolet ray regions, e.g., Re, Sb, Te, Au, Ag, Cu, Ge, Pb and Sn.

Further, particularly preferred metal fine particles are the fine particles of metals having a comparatively low melting point and comparatively high absorbance of heat ray, e.g., Ag, Au, Cu, Sb, Ge and Pb, and most preferred elements are Ag, Au and Cu.

The light-to-heat converting substance of the present invention may comprise two or more light-to-heat converting substances, e.g., the fine particles of low melting point metals, e.g., Re, Sb, Te, Au, Ag, Cu, Ge, Pb and Sn and the fine particles of self-exothermic metals, e.g., Ti, Cr, Fe, Co, Ni, W and Ge may be used as mixture. It is also preferred to use the minute pieces of metals which show particularly high light absorption in the state of minute pieces such as Ag, Pt and Pd and the minute pieces of other metals in combination.

The effect of the present invention is further exhibited by subjecting the above fine particles of simple substances or alloys of metals to surface hydrophilizing treatment. As the surface hydrophilizing treatment, a method of surface treatment by a compound which is hydrophilic and adsorptive onto particles, e.g., a surfactant, a method of surface treatment by a substance having a hydrophilic group which is reactive with the constituting substance of particles, and a method of providing a hydrophilic high polymer film of protective colloid can be used. A particularly preferred method is surface treatment with silicate. For example, the surfaces of fine particles can be sufficiently hydrophilized by immersing the fine particles in a sodium silicate aqueous solution (3%) at 70° C. for 30 seconds. Other metallic fine particles can also be surface-treated by the similar method.

These particles have a particle size of preferably 10 μm or less, more preferably from 0.003 to 5 μm, and particularly preferably from 0.01 to 3 μm. High sensitivity and good resolution can be obtained by the particle size of this range.

When these metallic fine particles are used as the light-to-heat converting agent in the invention, the addition amount is preferably 10 wt % or more of the solid content of the image-forming layer, more preferably 20 wt % or more, and particularly preferably 30 wt % or more. High sensitivity can be preferably obtained by the addition amount of this range.

Hydrophilic Resin:

The image-forming layer of the invention can contain a hydrophilic resin for the purpose of improving on-press development property and the film strength of the image-forming layer itself.

As the hydrophilic resins, those having a hydrophilic group, e.g., a hydroxyl group, a carboxyl group, a phosphoric acid group, a sulfonic acid group or an amido group are preferred. Further, since image strength is increased and press life is heightened by the reaction of the hydrophilic resins with a vinyloxy group and forming crosslinking, hydrophilic resins having functional groups reactive with a vinyloxy group, e.g., a hydroxyl group, a carboxyl group, a phosphoric acid group or a sulfonic acid group, are preferred. Above all, hydrophilic resins having a hydroxyl group or a carboxyl group are preferred.

The specific examples of the hydrophilic resins include gum arabic, casein, gelatin, starch derivatives, water-soluble soybean polysaccharide, hydroxypropyl cellulose, methyl cellulose, carboxymethyl cellulose and sodium salts thereof, cellulose acetate, sodium alginate, vinyl acetate-maleic acid copolymers, styrene-maleic acid copolymers, polyacrylic acids and salts thereof, polymethacrylic acid and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of at least 60 wt %, preferably at least 80 wt %, polyvinyl formal, polyvinyl pyrrolidone, homopolymers and copolymers of acrylamide, homopolymers and copolymers of methacrylamide, homopolymers and copolymers of N-methylolacrylamide, homopolymers and copolymers of 2-acrylamide-2-methyl-1-propanesulfonate, and homopolymers and copolymers of 2-methacryloyloxyethylsulfonate.

Other Additives:

For easily discriminating an image area from a non-image area after image formation, dyes having great absorption in the visible ray region can be used in the image-forming layer as the colorants of an image in the present invention. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015), and the dyes disclosed in JP-A-62-293247 can be exemplified. In addition to these dyes, phthalocyanine series pigments, azo series pigments and titanium oxide can also be preferably used. These dyes and pigments are used in the proportion of preferably from 0.01 to 10 wt % of all the solid content in the image-forming layer.

Plasticizers can be added to the image-forming layer of the invention, if necessary, for giving flexibility to the film. As such plasticizers, e.g., polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate, are used.

The image-forming layer of the present invention is manufactured by dissolving or dispersing the above each component in a solvent and coating the resulting coating solution. The examples of the solvents used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and water, but solvents are not limited thereto. These solvents are used alone or as mixture. The concentration of the solid content of the coating solution is preferably from 1 to 50 wt %.

The coating weight of the image-forming layer (solid content) on the support obtained after coating and drying varies according to use, but generally the dry coating weight is preferably from 0.2 to 5.0 g/$m^2$. Various coating methods can be used, e.g., bar coating, rotary coating, spray coating, curtain coating, dip coating, air knife coating, blade coating, and roll coating can be used.

Surfactants, e.g., the fluorine surfactants disclosed in JP-A-62-170950, can be added to the coating solution of the image-forming layer for improving the coating property. The addition amount is preferably from 0.01 to 1 wt % of all the solid contents of the image-forming layer, and more preferably from 0.05 to 0.5 wt %.

Overcoat Layer:

A hydrophilic overcoat layer can be provided on the image-forming layer of the lithographic printing plate precursor of the present invention for protecting the image-forming layer surface from smearing with lipophilic substances during storage or by touch with fingers in handling (fingerprints).

The hydrophilic overcoat layer preferably used in the present invention can be easily removed on a printing press and contains a resin selected from water-soluble resins and water-swellable resins obtained by partially crosslinking water-soluble resins.

The water-soluble resins are selected from water-soluble natural and synthetic high polymers, and when they are coated and dried alone or with a crosslinking agent, they can form a film.

The specific examples of the water-soluble resins preferably used in the invention include, as natural high polymers, gum arabic, water-soluble soybean polysaccharide, cellulose derivatives (e.g., carboxymethyl cellulose, carboxyethyl cellulose, and methyl cellulose), modified products of the same, white dextrin, pullulan, and enzyme-decomposing etherified dextrin, as synthetic high polymers, polyvinyl alcohol (having hydrolysis degree of 65% or more of polyvinyl acetate), polyacrylic acid and alkali metal salts or amine salts of the same, polyacrylic acid copolymers and alkali metal salts or amine salts of the same, polymethacrylic acid and alkali metal salts or amine salts of the same, vinyl alcohol-acrylic acid copolymers and alkali metal salts or amine salts of the same, polyacrylamide and copolymers of the same, polyhydroxyethyl acrylate, polyvinyl pyrrolidone and copolymers of the same, polyvinyl methyl ether, vinyl methyl ether-maleic anhydride copolymers, poly-2-acrylamide-2-methyl-1-propanesulfonic acid and alkali metal salts or amine salts of the same, poly-2-acrylamide-2-methyl-1-propanesulfonic acid copolymers and alkali metal salts or amine salts of the same.

These resins may be used as mixture of two or more according to purposes. However, the present invention is not limited to these compounds.

When at least one or more water-soluble resins are partially crosslinked and an overcoat layer is formed on the image-forming layer, crosslinking is performed by the crosslinking reaction using the reactive functional group of the water-soluble resins. The crosslinking reaction may be covalent bonding crosslinking or may be ionic bonding crosslinking.

The stickiness of the overcoat layer surface lowers by crosslinking and the handling property of a lithographic printing plate precursor becomes good, but when crosslinking progresses too much, the overcoat layer converts to lipophilic and the elimination of the overcoat layer on a printing press becomes difficult, so that appropriate crosslinking is preferred.

As preferred degree of partial crosslinking, when a lithographic printing plate precursor is immersed in water at 25° C. for 30 seconds to 10 minutes, a hydrophilic overcoat layer is not eluted and is left, and when immersed for 10 minutes or more, the elution is a confirmable degree.

As the compounds to be used in a crosslinking reaction (crosslinking agents), well-known polyfunctional compounds having a crosslinking property, e.g., polyepoxy compounds, polyamine compounds, polyisocyanate compounds, polyalkoxysilyl compounds, titanate compounds, aldehyde compounds, polyvalent metallic salt compounds and hydrazine can be exemplified.

A crosslinking agent can be used alone or two or more of crosslinking agents can be used as mixture. Particularly preferred crosslinking agents are water-soluble crosslinking agents but water-insoluble crosslinking agents can be used by being dispersed in water by a dispersant.

As particularly preferred combinations of a water-soluble resin and a crosslinking agent, combinations of a carboxylic acid-containing water-soluble resin and a polyvalent metal compound, a carboxylic acid-containing water-soluble resin and a water-soluble epoxy resin, and a hydroxyl group-containing resin and dialdehydes can be exemplified.

The preferred addition amount of a crosslinking agent is from 2 to 10 wt % of the water-soluble resin. In this range of the addition amount, good water resistance can be obtained without impairing the eliminating property of an overcoat layer on a printing press.

In addition, for the purpose of ensuring coating uniformity when an aqueous solution is coated, an overcoat layer may contain nonionic surfactants, e.g., sorbitan tristearate, sorbitan monopalmitate, sorbitan trioleate, stearic acid monoglyceride, polyoxyethylene nonylphenyl ether and polyoxyethylene dodecyl ether.

The proportion of the nonionic surfactant in an overcoat layer is preferably from 0.05 to 5 wt % of all the solid content in an overcoat layer, and more preferably from 1 to 3 wt %.

The layer thickness of the overcoat layer of the present invention is preferably from 0.1 to 4.0 μm when a water-soluble resin is not crosslinked, more preferably from 0.1 to 1.0 μm, and preferably from 0.1 to 0.5 μm when a water-soluble resin is partially crosslinked, more preferably from 0.1 to 0.3 μm. In this range of the layer thickness, smearing of the image-forming layer due to lipophilic substance can be prevented without impairing the eliminating property of the overcoat layer on a printing press.

Support:

The supports of the lithographic printing plate precursor of the present invention on which the above-described image-forming layer can be coated are materials having dimensional stability. For example, paper, paper laminated with plastics (e.g., polyethylene, polypropylene, and polystyrene), metal plates (e.g., aluminum, zinc and copper), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal), and paper and plastic films laminated or deposited with the above metals can be exemplified as the materials of the support. Preferred supports are polyester films and aluminum plates.

The aluminum plates are a pure aluminum plate and an aluminum alloy plate comprising aluminum as a main component and a trace amount of different elements, and an aluminum or aluminum alloy plate laminated with plastics may also be used. The different elements which may be contained in aluminum alloys are silicon, iron, manganese, copper, magnesium, chromium, zinc, bismuth, nickel and titanium. The content of the different elements in the aluminum alloy is at most 10 wt %. Well-known aluminum plates so far been used can also be arbitrarily used in the present invention.

The above-described supports for use in the present invention have a thickness of from 0.05 to 0.6 mm, preferably from 0.1 to 0.4 mm, and particularly preferably from 0.15 to 0.3 mm.

It is preferred to subject an aluminum plate to surface roughening and surface treatment such as anodization before use. By the surface treatment, a hydrophilic property is improved and the adhesion with the image-forming layer can be improved.

The surface-roughening treatment of the surface of an aluminum plate can be performed by various methods, e.g., mechanical surface-roughening treatment, electrochemical roughening by dissolving the surface, and chemical roughening by selectively dissolving the surface. As mechanical roughening, well-known methods, e.g., a ball rubbing method, a brush abrading method, a blasting method, or a buffing method, can be used. As chemical roughening, a method of roughening the surface by immersing an aluminum plate in a saturated aqueous solution of the aluminum salt of an inorganic acid as disclosed in JP-A-54-31187 is suitable. As electrochemical roughening, a method of surface-roughening in an electrolyte containing an acid such as a hydrochloric acid or a nitric acid by alternating current or direct current can be used. Further, electrolytic surface roughening using mixed acids can be used as disclosed in JP-A-54-63902.

These surface roughening treatments are preferably performed so that the central line average roughness (Ra) of the surface of an aluminum plate becomes from 0.2 to 1.0 μm.

The thus surface-roughened aluminum plate is, if required, subjected to alkali etching treatment with an aqueous solution of potassium hydroxide or sodium hydroxide and neutralizing treatment and then to anodizing treatment to increase the abrasion resistance of the surface.

Various electrolytes for forming porous oxide film can be used in the anodizing treatment of an aluminum plate and, in general, sulfuric acid, hydrochloric acid, oxalic acid, chromic acid and mixed acids of these are used. The concentration of these electrolytes are arbitrarily determined according to the kinds of electrolytes.

Anodizing treatment conditions vary according to electrolytes used and cannot be specified unconditionally, but in general the appropriate concentration of electrolyte is from 1 to 80 wt % solution, the liquid temperature is from 5 to 70° C., the electric current density is from 5 to 60 $A/dm^2$, the voltage is from 1 to 100 V, electrolytic time is from 10 seconds to 5 minutes.

The amount of the film formed is preferably from 1.0 to 5.0 $g/m^2$, particularly preferably from 1.5 to 4.0 $g/m^2$.

The support surface-treated and having an anodic oxide film as described above may be used as it is, but micro-pore enlarging treatment of an anodic oxide film, sealing treatment of micro-pores, and surface hydrophilizing treatment of immersing the support in an aqueous solution containing a hydrophilic compound as disclosed in Japanese Patent Application Nos. 2000-65219 and 2000-143387 may be performed arbitrarily for further improving adhering properties with the upper layer, hydrophilic properties, staining resistance and heat insulating properties, if necessary.

As the preferred hydrophilic compounds for the above hydrophilizing treatment, polyvinyl phosphonic acid, compounds having a sulfonic acid group, saccharide compounds, citric acid, alkali metal silicate, potassium zirconium fluoride, phosphate/inorganic fluorine compounds can be used in the present invention.

When a support, such as a polyester film, the surface of which is not sufficiently hydrophilic, is used as the support in the present invention, it is preferred to coat a hydrophilic layer to make the surface hydrophilic. A hydrophilic layer formed by coating a coating solution containing a colloidal oxide or hydroxide of at least one element selected from beryllium, magnesium, aluminum, silicon, titanium, boron, germanium, tin, zirconium, iron, vanadium, antimony and transition metals as disclosed in Japanese Patent Application No. 2000-10810 is preferred. A hydrophilic layer formed by coating a coating solution containing a colloidal oxide or hydroxide of silicon is preferred above all.

In the present invention, an inorganic subbing layer containing a water-soluble metal salt, e.g., zinc borate, or an organic subbing layer containing carboxymethyl cellulose, dextrin, or polyacrylic acid as disclosed in Japanese Patent Application No. 2000-143387 may be provided before coating an image-forming layer, if necessary. The above-described light-to-heat converting agent may be added to the subbing layer.

Plate-Making and Printing:

An image is formed by heating on a lithographic printing plate precursor in the present invention. Specifically, an image is recorded by direct imagewise recording with a thermal recording head, scanning exposure with an infrared laser, high intensity flash exposure by a xenon discharge lamp and the like, and infrared lamp exposure. Exposure by solid state high output infrared lasers such as semiconductor lasers emitting infrared rays of wavelength of from 700 to 1,200 nm and YAG lasers is preferred in the present invention.

An image-exposed lithographic printing plate precursor in the present invention can be mounted on a printing press without requiring any further process, and printing can be performed using ink and a fountain solution by an ordinary procedure.

As a simple lithographic printing method requiring no fountain solution, lithographic printing using emulsion ink as disclosed, e.g., in JP-B-49-26844, JP-B-49-27124, JP-B-49-27125, JP-A-53-36307, JP-A-53-36308, JP-B-61-52867, JP-A-58-211484, JP-A-53-27803, JP-A-53-29807, JP-A-54-146110, JP-A-57-212274, JP-A-58-37069 and JP-A-54-106305, can also be applied to the lithographic printing plate precursor of the present invention.

The lithographic printing plate precursor according to the present invention can also be subjected to exposure after being mounted on a plate cylinder by the laser installed on a printing press, and then to on-press development with a fountain solution and/or ink, as disclosed in Japanese patent 2938398.

The lithographic printing plate precursor in the present invention can also be used in printing after development with water or an aqueous solution as a developing solution.

EXAMPLE

The present invention is illustrated in more detail with reference to examples below, but these are not to be construed as limiting the invention.

Preparation Example of Support

The molten metal of JIS A1050 alloy containing 99.5% or more of aluminum, 0.30% of Fe, 0.10% of Si, 0.02% of Ti and 0.013% of Cu was subjected to purification treatment and casting. In the purification treatment, degassing treatment for eliminating unnecessary gases in the molten metal, such as hydrogen, and ceramic tube filter treatment were carried out. Casting was performed by DC casting method. The solidified ingot having a thickness of 500 mm was subjected to facing in a thickness of 10 mm from the surface and homogenizing treatment was performed at 550° C. for 10 hours so that the intermetallic compound was not coarsened. In the next place, the plate was subjected to hot rolling at 400° C., then process annealing in a continuous annealing furnace at 500° C. for 60 seconds, and then cold rolling, to thereby produce an aluminum rolled plate having a thickness of 0.30 mm. The central line average roughness (Ra) of the aluminum plate surface after cold rolling was controlled to become 0.2 μm by controlling the roughness of pressure roll. The plane distortion of the plate was then improved by a tension leveller.

The plate was surface-treated to obtain a lithographic printing plate support.

In the first place, the aluminum plate was degreased with a 10% aqueous solution of sodium aluminate at 50° C. for 30 seconds to eliminate the rolling oil on the surface of the plate, neutralized in a 30% aqueous solution of sulfuric acid at 50° C. for 30 seconds, and then subjected to desmutting treatment.

In the next place, the surface of the support was subjected to brush-graining treatment, i.e., surface roughening treatment, for improving adhering property of the support and the image-forming layer and giving water retentivity to the non-image area. An aqueous solution containing 1% of nitric acid and 0.5% of aluminum nitrate was maintained at 45° C., and on the condition of electric current density of 20 $A/dm^2$ by indirect electric power supplying cell, the plate was subjected to electrolytic graining by the quantity of electricity of anode side of 240 $C/dm^2$ using alternating waveform of duty ratio of 1/1 with conveying the aluminum web in the aqueous solution. Subsequently, the plate was subjected to etching in a 10% sodium aluminate aqueous solution at 50° C. for 30 seconds, neutralization in a 30% sulfuric acid aqueous solution at 50° C. for 30 seconds, and then desmutting treatment.

Further, for improving abrasion resistance, chemical resistance and water retentivity, an oxide film was formed on the support by anodization. A 20% sulfuric acid aqueous solution was used as the electrolyte at 35° C. An anodic oxide film of 2.5 $g/m^2$ was formed by the electrolytic treatment with direct current of 14 $A/dm^2$ by indirect electric power supplying cell with conveying the aluminum web through the electrolyte.

Subsequently, silicate treatment was performed for ensuring hydrophilic properties as the non-image area of the printing plate. A 1.5% aqueous solution of disodium trisilicate was maintained at 70° C. and the aluminum web was conveyed so that the contact time of the aluminum web with the aqueous solution became 15 seconds and the web was further washed with water. The adhered amount of Si was 10 mg/$m^2$. The central line average roughness (Ra) of the surface of the thus-obtained support (1) was 0.25 μm.

Synthesis Example of Hydrophobic Polymer Fine Particles (1)

As an oil phase component, 5 g of a cresol novolak resin (m-/p- ratio: 6/4, a weight average molecular weight: 3,000, a number average molecular weight: 1,100), 1.5 g of an infrared absorber (exemplified Compound IR-17), 1 g of onium group-containing polymer No. 1 (described in this specification), and 0.1 g of anionic surfactant Pionin A-41C (manufactured by Takemoto Yushi Co., Ltd.) were dissolved in 7.4 g of acetonitrile and 13.7 g of ethyl acetate. The above oil phase component was mixed with 53 g of a 1.8% aqueous solution of polyvinyl alcohol (PVA205, manufactured by Kuraray Co., Ltd.) of a water phase component, and the mixture was emulsified and dispersed with a homogenizer at 15,000 rpm for 10 minutes. Methyl ethyl ketone and ethyl acetate were evaporated with stirring the mixture at 40° C. for 3 hours. The concentration of the solid content of the thus-obtained fine particle dispersion was 14.8 wt % and the average particle size was 0.30 μm.

Synthesis Example of Hydrophobic Polymer Fine Particles (2)

Fine particles (2) were synthesized in the same manner as in synthesis example of fine particles (1) except for changing the onium group-containing polymer No. 1 to a copolymer of 4-diazodiphenylaminehexafluorophosphate and formaldehyde (a weight average molecular weight: 2,000, a number average molecular weight: 900).

The concentration of the solid content of the thus-obtained fine particle dispersion was 14.5 wt % and the average particle size was 0.26 μm.

Synthesis Example of Hydrophobic Polymer Fine Particles (3)

Fine particles (3) were synthesized in the same manner as in synthesis example of fine particles (1) except for changing the onium group-containing compound to hexafluorophosphate ionic salt of 4-diazodiphenylamine (having the formula shown below). The concentration of the solid content of the thus-obtained fine particle dispersion was 14.4 wt % and the average particle size was 0.32 μm.

Synthesis Example of Hydrophobic Polymer Fine Particles (4)

As an oil phase component, 5 g of polyethyl methacrylate (a weight average molecular weight: 30,000, a number average molecular weight: 12,000), 1.5 g of an infrared absorber (exemplified Compound IR-12), 1 g of onium group-containing polymer No. 4 (shown above), and 0.1 g of anionic surfactant Pionin A-41C (manufactured by Takemoto Yushi Co., Ltd.) were dissolved in 7.4 g of acetonitrile and 13.7 g of ethyl acetate. The above oil phase component was mixed with 53 g of a 1.8% aqueous solution of polyvinyl alcohol (PVA205, manufactured by Kuraray Co., Ltd.) of a water phase component, and the mixture was emulsified and dispersed with a homogenizer at 15,000 rpm for 10 minutes. Methyl ethyl ketone and ethyl acetate were evaporated with stirring the mixture at 40° C. for 3 hours. The concentration of the solid content of the thus-obtained fine particle dispersion was 14.9 wt % and the average particle size was 0.35 μm.

Synthesis Example of Hydrophobic Polymer Fine Particles (5) for Comparison:

As an oil phase component, 6 g of a cresol novolak resin (m-/p- ratio: 6/4, a weight average molecular weight: 3,000, a number average molecular weight: 1,100), 1.5 g of an infrared absorber (exemplified Compound IR-17), and 0.1 g of anionic surfactant Pionin A-41C (manufactured by Takemoto Yushi Co., Ltd.) were dissolved in 7.4 g of acetonitrile and 13.7 g of ethyl acetate. The above oil phase component was mixed with 53 g of a 1.8% aqueous solution of polyvinyl alcohol (PVA205, manufactured by Kuraray Co., Ltd.) of a water phase component, and the mixture was emulsified and dispersed with a homogenizer at 15,000 rpm for 10 minutes. Methyl ethyl ketone and ethyl acetate were evaporated with stirring the mixture at 40° C. for 3 hours. The concentration of the solid content of the thus-obtained fine particle dispersion was 14.5 wt % and the average particle size was 0.30 μm.

Synthesis Example of Microcapsules (1)

As an oil phase component, 40 g of a 50% ethyl acetate solution of the adduct of trimethylolpropane and xylylene diisocyanate (Takenate D-110N, a microcapsule wall material, manufactured by Takeda Chemical Industries Ltd.), 23.5 g of a cresol novolak resin (m-/p- ratio: 6/4, a weight average molecular weight: 3,000, a number average molecular weight: 1,100), 4 g of a copolymer of 4-diazodiphenylamine-hexafluorophosphate and formaldehyde (a weight average molecular weight: 2,000, a number average molecular weight: 900), 3 g of an infrared absorber (exemplified Compound IR-17), and 0.1 g of Pionin A-41C were dissolved in 30 g of acetonitrile and 60 g of ethyl acetate. As a water phase component, 120 g of a 4% aqueous solution of PVA205 was prepared. The oil phase component and the water phase component were emulsified with a homogenizer at 10,000 rpm for 10 minutes, then 200 g of water was added thereto, and the emulsion was stirred at room temperature for 30 minutes and further at 40° C. for 3 hours. The concentration of the solid content of the thus-obtained microcapsule solution was 15.5 wt % and the average particle size was 0.35 μm.

Synthesis Example of Microcapsules (2)

Microcapsules (2) were prepared in the same manner as in the synthesis example of microcapsules (1) except for changing 4 g of the copolymer of 4-diazodiphenylamine-hexafluorophosphate and formaldehyde to the above-shown onium group-containing polymer No. 2.

The concentration of the solid content of the thus-obtained microcapsule solution was 15.3 wt % and the average particle size was 0.32 μm.

Synthesis Example of Microcapsules (3) for Comparison

As an oil phase component, 40 g of a 50% ethyl acetate solution of the adduct of trimethylolpropane and xylylene diisocyanate (Takenate D-110N, a microcapsule wall material, manufactured by Takeda Chemical Industries Ltd.), 27.5 g of a cresol novolak resin (m-/p- ratio: 6/4, a weight average molecular weight: 3,000, a number average molecular weight: 1,100), 3 g of an infrared absorber (exemplified Compound IR-17), and 0.1 g of Pionin A-41C were dissolvedin 30 g of acetonitrile and 60 g of ethyl acetate. As a water phase component, 120 g of a 4% aqueous solution of PVA205 was prepared. The oil phase component and the water phase component were emulsified with a homogenizer at 10,000 rpm for 10 minutes, then 200 g of water was added thereto, and the emulsion was stirred at room temperature for 30 minutes and further at 40° C. for 3 hours. The concentration of the solid content of the thus-obtained microcapsule solution was 15.2 wt % and the average particle size was 0.28 μm.

Synthesis Example of Microcapsules (4)

As an oil phase component, 40 g of a 50% ethyl acetate solution of the adduct of trimethylolpropane and xylylene diisocyanate (Takenate D-110N, a microcapsule wall material manufactured by Takeda Chemical Industries Ltd.), 23.5 g of dipentaerythritol pentaacrylate (SR-399E, manufactured by Nippon Kayaku Co., Ltd.), 5 g of onium group-containing polymer No. 3 described in this specification, 5 g of triazine T-1 shown below, 3 g of an infrared absorber (exemplified Compound IR-16 of the present invention), and 0.1 g of Pionin A-41C were dissolved in 30 g of acetonitrile and 60 g of ethyl acetate. As a water phase component, 120 g of a 4% aqueous solution of PVA205 was prepared. The oil phase component and the water phase component were emulsified with a homogenizer at 10,000 rpm for 10 minutes, then 200 g of water was added thereto, and the emulsion was stirred at room temperature for 30 minutes and further at 40° C. for 3 hours. The concentration of the solid content of the thus-obtained microcapsule solution was 16.8 wt % and the average particle size was 0.38 μm.

Triazine T-1

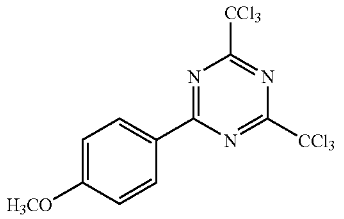

Examples 1 to 7 and Comparative Examples 1 and 2

Each of image-forming layer coating solutions (1) to (9) was prepared from the composition shown below containing fine particle component selected from fine particles (1) to (5) and microcapsules (1) to (4) in the synthesis examples in the combination as shown in Table 1. Each image-forming layer coating solution was coated on the above-prepared support by bar coating and dried in an oven at 60° C. for 120 seconds, thus each lithographic printing plate precursor having a dry coating amount of the image-forming layer of 1 g/m$^2$was produced.

Image-Forming Layer Coating Solution:

| | |
|---|---|
| Water | 25 g |
| Fine particles or microcapsules | 20 g |

The thus-obtained lithographic printing plate precursor was subjected to exposure using Trendsetter 3244VFS (manufactured by Creo Co., Ltd) installing a water-cooling type 40 W infrared semiconductor laser on the conditions of output of 9 W, external drum rotating speed of 210 rpm, printing plate energy of 100 mJ/m$^2$, and resolution of 2,400 dpi. The exposed precursor was mounted on the plate cylinder of a printing press SOR-M (manufactured by Heidelberg Japan K. K.) without further developing treatment, and printing was performed after feeding a fountain solution, then an ink, and then printing paper.

The results obtained are shown in Table 1 below.

TABLE 1

| Example No. | Kind of Fine Particles or Microcapsules | Press Life (number of sheets) | Number of Mackled Sheets |
|---|---|---|---|
| Example 1 | Fine particles (1) | 20,000 | 15 |
| Example 2 | Fine particles (2) | 35,000 | 18 |
| Example 3 | Fine particles (3) | 15,000 | 10 |
| Example 4 | Fine particles (4) | 20,000 | 9 |
| Example 5 | Microcapsules (1) | 30,000 | 13 |
| Example 6 | Microcapsules (2) | 24,000 | 12 |
| Example 7 | Microcapsules (4) | 36,000 | 16 |
| Comparative Example 1 | Fine particles (5) | 8,000 | 12 |
| Comparative Example 2 | Microcapsules (3) | 6,000 | 11 |
| Comparative Example 3 | Fine particles (5) | 10,000 | 100 or more |
| Comparative Example 4 | Microcapsules (3) | 9,000 | 100 or more |

Comparative Examples 3 and 4

In the same manner as in Example 1, image-forming layer coating solutions (10) and (11) were prepared from the composition shown below containing fine particle component (3) or microcapsules (3) in the synthesis examples, thus each image-forming layer was formed on the above-prepared support.

Image-Forming Layer Coating Solution:

| | |
|---|---|
| Water | 25 g |
| Fine particles (5) or microcapsules (3) | 20 g |
| 4-Diazodiphenylaminesulfate | 0.30 g |

The obtained photosensitive material was subjected to exposure and printing was performed on the same condition as in Example 1. One hundred or more mackled sheets were required until the non-image area was eliminated and good printed matters could be obtained, and the improving effect of press life was small.

From the above results, it can be seen that lithographic printing plate precursors comprising hydrophobic polymer particles containing a compound having an onium group, and microcapsules encapsulating a compound having an onium group exhibit high on-press development property, and high press life at the same time.

As described above, in the lithographic printing plate precursor of the present invention, an image area generates heat by a light-to-heat converting substance by scanning exposure based on digital signals, and the hydrophobic polymer particles contained in an image-forming layer are at least partially fused, or a hydrophobic compound is released from microcapsules, and a hydrophobic layer is formed. At the same time, an onium group having strong interaction with a hydrophilic substrate is released only at a part which generates heat by exposure, thus the adhesion of the image-forming layer to the substrate is improved. By virtue of this constitution, the present invention can provide a lithographic printing plate precursor exhibiting good on-press development property, high sensitivity, improved adhesion of a heated image area to the substrate, and excellent press life as well.

While the invention has been described in detail and with reference to specific examples thereof, it will be apparent to one skilled in the art that various changes and modifications can be made therein without departing from the spirit and scope thereof.

This application is based on Japanese Patent application JP 2002-068628, filed Mar. 13, 2002, the entire content of which is hereby incorporated by reference, the same as if set forth at length.

What is claimed is:

1. A lithographic printing plate precursor comprising:

a hydrophilic support; and an image-forming layer which comprises (A) at least one of: hydrophobic polymer particles comprising a compound having an onium group, said compound being an oligomer or polymer having a diazonium group, a phosphonium group or a pyridinium group; and microcapsules encapsulating a compound having an onium group, said compound being an oligomer or polymer having a diazonium group, a phosphonium group or a pyridinium group, and a hydrophobic compound, and (B) a light-to-heat converting agent.

2. The lithographic printing plate precursor according to claim 1, wherein the compound having an onium group has two or more onium salt moieties per a molecule.

3. The lithographic printing plate precursor according to claim 1, wherein the compound having an onium group is a diazonium salt.

4. The lithographic printing plate precursor according to claim 2, wherein the compound having an onium group is a diazonium salt.

5. The lithographic printing plate precursor according to claim 1, wherein the compound having an onium group comprises at least one of structural units represented by the following formulae (1), (2), and (3):

(1)

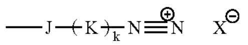

(2)

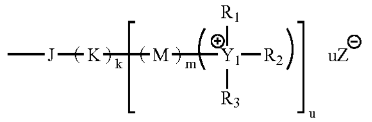

(3)

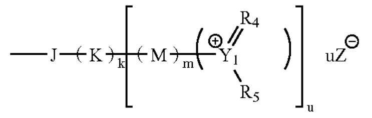

wherein J represents a divalent to tetravalent linking group; K represents an aromatic group or a substituted aromatic group; $X^-$ represents a counter anion; M represents a divalent linking group; $Y_1$ represents P in formula (2) and N in formula (3); $Z^-$ represents a counter anion; $R_1$, $R_2$, and $R_3$ each independently represents an alkyl group, an aromatic group or an aralkyl group to each of which a hydrogen atom or, a substituent may be bonded; $R_4$ represents an alkylidyne group or a substituted alkylidyne group, $R_5$ represents an alkyl group, $R_1$ and $R_2$ may be bonded to each other to form a ring, $R_4$ and $R_5$ are bonded to form a pyridinium ring; k and m each independently represents 0 or 1; and u represents an integer of from 1 to 3.

6. The lithographic printing plate precursor according to claim 1, wherein the hydrophobic polymer particles have an average particle size of from 0.01 to 3 μm, and an amount of the hydrophobic polymer particles is 40 wt % or more based on a solid content in the image-forming layer.

7. The lithographic printing plate precursor according to claim 1, wherein the microcapsules has an average particle size of from 0.01 to 20 μm, and an amount of the microcapsules is 50 wt % or more based on a solid content in the image-forming layer.

8. The lithographic printing plate precursor according to claim 1, wherein the light-to-heat converting agent comprises metallic particles comprising Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re or Sb.

9. The lithographic printing plate precursor according to claim 1, wherein the light-to-heat converting agent comprises metallic particles comprising Re, Sb, Te, Au, Ag, Cu, Ge, Pb or Sn.

10. The lithographic printing plate precursor according to claim 1, wherein the image-forming layer further comprises a hydrophilic resin having a hydroxyl group, a carboxyl group, a phosphoric acid group, a sulfonic acid group or an amido group.

11. The lithographic printing plate precursor according to claim 1, further comprising a hydrophilic overcoat layer.

12. The lithographic printing plate precursor according to claim 1, wherein the compound having an onium group is encapsulated in the hydrophobic polymer particles or the microcapsules.

13. The lithographic printing plate precursor according to claim 2, wherein the compound having an onium group is encapsulated in the hydrophobic polymer particles or the microcapsules.

14. The lithographic printing plate precursor according to claim 1, wherein the light-to-heat converting agent is a cyanine dye.

15. The lithographic printing plate precursor according to claim 2, wherein the light-to-heat converting agent is a cyanine dye.

16. The lithographic printing plate precursor according to claim 1, wherein the compound having an onium group is present in an amount 3 to 50 wt. % of the hydrophobic polymer component in the hydrophobic polymer particles or of the hydrophobic compound component in the microcapsules.

* * * * *